United States Patent [19]

Ciszek

[11] Patent Number: 4,721,539

[45] Date of Patent: Jan. 26, 1988

[54] LARGE SINGLE CRYSTAL QUATERNARY ALLOYS OF IB-IIIA-SE$_2$ AND METHODS OF SYNTHESIZING THE SAME

[75] Inventor: Theodore F. Ciszek, Evergreen, Colo.

[73] Assignee: The United States of America as represented by the United States Department of Energy, Washington, D.C.

[21] Appl. No.: 885,977

[22] Filed: Jul. 15, 1986

[51] Int. Cl.$^4$ .................... C22C 28/00; C22C 9/00
[52] U.S. Cl. .................... 148/400; 148/442; 420/489; 420/497; 420/500; 420/502; 420/555; 420/579; 420/587
[58] Field of Search ............ 420/489, 497, 500, 502, 420/555, 579, 587; 148/400, 442

[56] References Cited

U.S. PATENT DOCUMENTS

| | | | |
|---|---|---|---|
| 3,154,384 | 10/1964 | Jones | 422/249 |
| 3,401,023 | 9/1968 | Mullin | 156/604 |
| 3,472,615 | 10/1969 | Wang | 156/607 |
| 3,647,389 | 3/1972 | Weiner | 156/604 |
| 3,649,192 | 3/1972 | Deyris | 420/555 |
| 3,649,193 | 3/1972 | Deyris | 156/607 |
| 3,741,817 | 6/1973 | Bienert et al. | 156/605 |
| 3,962,027 | 6/1976 | Bruton et al. | 156/624 |
| 4,264,385 | 4/1981 | Fisher | 156/607 |
| 4,303,464 | 12/1981 | Suzuki et al. | 156/617 SP |
| 4,431,476 | 2/1984 | Watanabe et al. | 156/607 |
| 4,478,675 | 10/1984 | Akai | 156/605 |
| 4,483,735 | 11/1984 | Inada et al. | 156/607 |
| 4,528,061 | 7/1985 | Miyazawa et al. | 156/605 |
| 4,585,511 | 4/1986 | Bult et al. | 156/607 |

OTHER PUBLICATIONS

Ciszek, T. F., *Synthesis and Crystal Growth of Copper Indium Diselenide from the Melt*, J. Electronic Materials, 14:4, pp. 451–460, 1985.

Chapman, G. H. et al., Lattice Constants and Band-Gap Variations of the Pentenary Semiconductor System Cu$_{1-y}$Ag$_y$InS$_{2(1-x)}$Se$_{2x}$, Appl. Phys., Lett., 34:11, pp. 735–737, 1979.

Primary Examiner—L. Dewayne Rutledge
Assistant Examiner—George Wyszomierski
Attorney, Agent, or Firm—Kenneth L. Richardson; Michael J. Higgins; Judson R. Hightower

[57] ABSTRACT

New alloys of Cu$_x$Ag$_{(1-x)}$InSe$_2$ (where x ranges between 0 and 1 and preferably has a value of about 0.75) and CuIn$_y$Ga$_{(1-y)}$Se$_2$ (where y ranges between 0 and 1 and preferably has a value of about 0.90) in the form of single crystals with enhanced structure perfection, which crystals are substantially free of fissures are disclosed. Processes are disclosed for preparing the new alloys of Cu$_x$Ag$_{(1-x)}$InSe$_2$. The process includes placing stoichiometric quantities of a Cu, Ag, In, and Se reaction mixture or stoichiometric quantities of a Cu, In, Ga, and Se reaction mixture in a refractory crucible in such a manner that the reaction mixture is surrounded by B$_2$O$_3$, placing the thus loaded crucible in a chamber under a high pressure atmosphere of inert gas to confine the volatile Se to the crucible, and heating the reaction mixture to its melting point. The melt can then be cooled slowly to form, by direct solidification, a single crystal with enhanced structure perfection, which crystal is substantially free of fissures.

2 Claims, 1 Drawing Figure

LARGE SINGLE CRYSTAL QUATERNARY ALLOYS OF IB-IIIA-SE$_2$ AND METHODS OF SYNTHESIZING THE SAME

CONTRACTUAL ORIGIN OF THE INVENTION

The U.S. Government has rights in this invention under contract No. DE-AC02-83CH10093 between the U.S. Department of Energy and the Solar Energy Research Institute, a Division of Midwest Research Institute.

BACKGROUND OF THE INVENTION

1. Field of the Invention

The present invention is related generally to large single-crystal quaternary alloys of the IB-IIIA-Se$_2$ type having chalcopyrite structure. More specifically it relates to large single crystal chalcopyrite alloys of Cu$_x$Ag$_{(1-x)}$InSe$_2$ and CuIn$_y$Ga$_{(1-y)}$Se$_2$, where x is in the range of about 0.45 to about 0.9 and y is in the range of about 0.8 to about 0.98. The invention also relates to methods for preparing such large, high-quality single-crystal alloys of the same having chalcopyrite structure.

2. Description of the Prior Art

Although the full extent of their potential is not presently known, crystal alloys of copper-indium-diselenide (CuInSe$_2$) are of interest in the semiconductor industry as potential semiconductor material, especially for heterojunction type semiconductors and as candidates for photovoltaic power systems and in opto-electronic applications.

In the not too distant past, the process of producing CuInSe$_2$ was cumbersome and inadequate. However, the inventor of the present application has in copending U.S. patent application Ser. No. 06/676,343, filed Nov. 29, 1984, provided an improved method for producing CuInSe$_2$. This method is also disclosed by the inventor in *J. Electron. Mater.*, Vol. 14, pp. 451 (1982). Although set forth in greater detail and with particularity in that application and article; the method in general comprises the steps of placing in a refractory container a reaction mixture of copper (Cu), indium (In), and selenium (Se) calculated by atomic percent to produce the desired composition. Additionally boric oxide (B$_2$O$_3$) is placed over the Cu, In, and Se reaction mixture in a sufficient quantity so that when the B$_2$O$_3$ is melted it will cover and encapsulate the Cu, In, and Se in the container. The container with the reaction mixture and B$_2$O$_3$ is placed in a closed, high-pressure chamber with an inert pressurized gas environment, such as argon or helium gas. The chamber is pressurized to reduce the vaporization of Se, which is otherwise easily vaporized. The container and its contents are then heated to at least 1005° C. and preferably to about 1025° C. to 1100° C. to melt the B$_2$O$_3$ and melt and react the reaction mixture. The melt is held at such elevated temperatures under inert gas pressure for several hours to synthesize and equilibrate the reaction mixture to CuInSe$_2$.

As taught in the referenced copending application, the crystal structure of CuInSe$_2$ can then be grown in two ways. In one crystal growth method, where directional solidification or Bridgman/Stockbarger-type growth is desired, a seed crystal is inserted into the crucible and partially melted to initiate single-crystal growth and the temperature is then slowly lowered. If a single-crystal structure is required, the cooling rate is controlled, and should be in the range of about 5° C./h to obtain proper ordering through the sphaleritic phase to the chalcopyrite phase. The cooling rate can be faster if a single-crystal structure is not required. In another method, the Czochralski crystal growth method, a seed crystal of CuInSe$_2$ is inserted through the encapsulating B$_2$O$_3$ melt to contact the CuInSe$_2$ melt. The melt temperature is then adjusted until crystal growth begins to occur on the seed. The seed is then raised upward, with rotation, at a speed of not more than about 10 mm/h to grow the crystal.

As noted above, CuInSe$_2$ has been investigated as a candidate material for thin-film photovoltaic power systems and for opto-electronic applications. CuInSe$_2$ is known to have utility for such applications, and especially for photovoltaic usage as it is a direct band-gap semiconductor with an optical absorpotion coefficient greater than $10^5$ cm$^{-1}$ over most of the solar spectrum and has an unusually steep absorption edge near 1 eV. Therefore CuInSe$_2$ absorbs most incident light in a thickness of 1 $\mu$m. Thin solar cells of CuInSe$_2$, which operate at approximately 11% efficiency, have been made in the laboratory. However, it appears that the band-gap energy of CuInSe$_2$, which is about 1.05 eV, is too small to allow significantly higher photovoltaic conversion efficiencies despite the excellent absorption characteristics of the material. Methods of increasing the band-gap energy of CuInSe$_2$ by alloying have been attempted. For example, in 1979, a technique using spray pyrolysis to form and study thin films of gallium modified copper-indium diselenide alloys (CuIn$_y$Ga$_{(1-y)}$Se$_2$) was published by B. R. Pamplin in *Prog. Crystal Growth Charact.* Vol. 1, pp. 395–403. This work verified that the band-gap energy of the CuIn$_y$Ga$_{(1-y)}$Se$_2$ alloys does increase as y decreases (from 1 to 0). However, the resulting alloy films were extremely thin, several microns or less, were polycrystalline in nature, had a grain size on the order of several microns or less, and had sphalerite structure. Also in 1979 Chapman, et al. reported in *Appl. Phys. Letters*, Vol. 34, pp. 735–737 on the fabrication of a sintered powder specimen of silver modified copper-indium-diselenide (Cu$_{0.5}$Ag$_{0.5}$InSe$_2$), and used the specimen for property measurements. However, the resulting sintered powder was neither an alloy nor a crystal. Presently no method is known or available for obtaining large single-crystal alloys of Cu$_x$Ag$_{(1-x)}$InSe$_2$ and CuIn$_y$Ga$_{(1-y)}$Se$_2$ having chalcopyrite structure. Similarly, large, single crystal alloys of Cu$_x$Ag$_{(1-x)}$InSe$_2$ and CuIn$_y$Ga$_{(1-y)}$Se$_2$ having chalcopyrite structures are not known to exist in the prior art.

SUMMARY OF THE INVENTION

Accordingly, it is a general object of the present invention to provide new and improved quaternary alloys of high quality single crystal IB-IIIA-Se$_2$ having chalcopyrite structure.

It is a specific object of this invention to provide improved alloys of large, single crystal Cu$_x$Ag$_{(1-x)}$InSe$_2$ and CuIn$_y$Ga$_{(1-y)}$Se$_2$ having chalcopyrite structure, where x is in the range of about 0.45 to about 0.9, and where y is in the range of about 0.8 to about 0.98.

It is another specific object of the present invention to provide a method of producing such alloys of Cu$_x$Ag$_{(1-x)}$InSe$_2$ and CuIn$_y$Ga$_{(1-y)}$Se$_2$ without the use of spray pyrolysis or sintering.

Additional objects, advantages, and novel features of the present invention are set forth in part in the description that follows, and in part will become apparent to those skilled in the art upon examination of the following, or by the practice of the invention. The objects and advantages of the invention may be specifically realized and attained by means of the alloys and methods particularly pointed out in the appended claims.

To achieve the foregoing and other objects and in accordance with the purpose of the present invention, as embodied and broadly described herein, the method of this invention will comprise the steps of placing in a refractory container a reaction mixture of Cu, Ag, In, and Se; or a reaction mixture of Cu, In, Ga, and Se where each such reaction mixture is calculated by atomic percent to produce the desired alloy. Within each refractory container $B_2O_3$ will be interspersed with the reaction mixture in a sufficient quantity that when the $B_2O_3$ and the reaction mixture are melted the $B_2O_3$ will completely cover and encapsulate the reaction mixture within the refractory container. The container with the reaction mixture and $B_2O_3$ will then be placed in a chamber with an inert or non-reactive environment, which contains such gases as helium, argon, or nitrogen that are pressurized to minimize the loss of volatile Se at elevated temperatures. The container and its contents will then be heated to at least the melting temperature of the reaction mixture and as high as about 1100° C. to melt and react the contents of the container. The melt will then be held at such elevated temperatures under pressure for several hours to equilibrate the melt and synthesize the alloy.

At this point, the chalcopyrite crystal structure of the $Cu_xAg_{(1-x)}Se_2$ alloy or of the $CuIn_yGa_{(1-y)}Se_2$ alloy will then be grown using, for example, a modified form of the liquid encapsulated Bridgman/Stockbarger method, with or without the use of seed crystals to initiate growth. Other controlled cooling methods, such as the Czochralski method, may also be used in the growth of the chalcopyrite crystal structure of the alloys.

Various alloys of $Cu_xAg_{(1-x)}InSe_2$ and $CuIn_yGa_{(1-y)}Se_2$ will thus be produced by varying x and y from 0 to 1. It has been determined that large, single-crystal chalcopyrite quaternary alloys of $Cu_xAg_{(1-x)}InSe_2$ will be found to be produced when x is in the range of from about 0.45 to about 0.9, with the crystals being particularly large and substantially free of cracks and voids when x is in the range of from about 0.65 to about 0.8. It has been similarly determined that large, single-crystal quaternary chalcopyrite alloys of $CuIn_yGa_{(1-y)}Se_2$ will be produced when y is in the range of from about 0.8 to about 0.98, with the crystals being particularly large and substantially free of cracks and voids when y is in the range of from about 0.85 to about 0.95. Each of these large, single-crystal, chalcopyrite alloys will be found to have good optical absorption coefficients and increased band-gap energy, as compared to $CuInSe_2$.

For a fuller understanding of the nature and objects of the invention, reference should be had to the following detailed description taken in conjunction with the accompanying drawing.

BRIEF DESCRIPTION OF THE DRAWING

The accompanying drawing, which is incorporated in and forms a part of the specification, illustrates a complete embodiment of the apparatus utilized in the practice of the method of the present invention according to the best mode presently conceived for the experimental application thereof, and together with the description assists in explaining the principles of the invention. In the drawing.

DETAILED DESCRIPTION OF THE PREFERRED EMBODIMENTS

Figure 1:
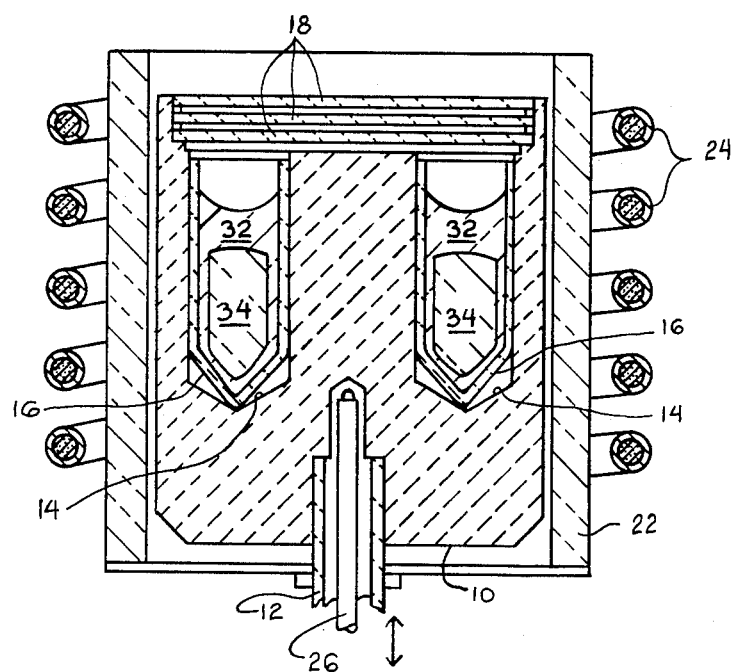
FIG. 1 is a cross-sectional view in elevation, of the hot zone of a radio-frequency (rf) heating system in which is located an experimental multiampoule susceptor containing melted reaction mixture and $B_2O_3$ for use in the practice of the method of the present invention for the production of $Cu_xAg_{(1-x)}InSe_2$ and $CuIn_yGa_{(1-y)}Se_2$.

Large, single-crystal $Cu_xAg_{(1-x)}InSe_2$, and large, single crystal $CuIn_yGa_{(1-y)}Se_2$ alloys having chalcopyrite structure are not known to have previously existed.

The apparatus used in experimentally producing such alloys and used in the practice of the method of the present invention is illustrated in FIG. 1. In operation the experimental apparatus would generally be surrounded by a hollow pressure chamber, not shown herein, but generally of the type detailed and described in copending U.S. application Ser. No. 06/676,343, filed Nov. 29, 1984, the contents of which are specifically incorporated herein by reference. As taught therein, the interior of such a chamber is adapted to contain very high gas pressures.

Inside such a high-pressure chamber, a cylindrical conductive refractory crucible or susceptor 10, made for example of graphite or molybdenum, will be positioned on a vertically movable support 12. In this experimental version, the susceptor 10 will have a number of cylindrical cavities 14, so that a number of different compositions, or a number of same compositions can be produced simultaneously. In this embodiment there will be six cavities 14, at radially symmetrical positions, so that six compositions can be produced simultaneously. Each cavity will be capable of holding a tall refractory ampoule 16, for example of quartz composition. In the embodiments shown, each ampoule 16 had a 15 mm inner diameter, was 47 mm tall, and had a pointed bottom and an open top. After ampoules containing a reaction mixture and $B_2O_3$ are loaded in susceptor 10, three refractory heat shields 18, for example of graphite, will be stacked above the ampoules in the open top of the susceptor. However, heat shields 18 will not close the open tops of the ampoules 16 to the atmosphere of the chamber. A cylindrical insulator sleeve 22, for example of quartz, surrounds the susceptor 10. An rf induction heating coil 24, normally operating at about 400 kHz will be positioned concentrically around the outside of the insulator sleeve 22. The temperature of the susceptor 10 will be monitored by a control thermocouple 26 having its tip within the open central axis of the susceptor at a height slightly above the bottoms of the ampoules 16.

A closed-circuit television camera, not shown, may be positioned in the chamber for monitoring the melt and crystal growth. An inlet tube, not shown, will be provided for pumping inert or nonreactive gas, such as argon, helium, or nitrogen, under high pressure into the chamber for pressurizing the space above the open ampoules 16. Relative vertical motion between the rf coil 24 and all of the other components shown in FIG. 1 is made possible by the vertical up or down movement of a support 12, for example by the action of a motor, not shown, to which it is connected. Such a motor would normally be outside of the high pressure chamber.

Referring again to FIG. 1, a multiampoule susceptor 10 will initially be positioned by a support 12 in the hot zone of the rf coil 24. At the start of the process of producing the alloys of the present invention, measured amounts of Cu, Ag, In, and Se reaction mixture or measured amounts of Cu, In, Ga, and Se reaction mixture will be placed in the ampoules 16, which will in turn be placed in the susceptor 10, as required for alloy preparation and crystal growth. Essentially, for the preparation of $Cu_xAg_{(1-x)}InSe_2$ alloys these atomic proportions are n % Cu, (25-n) % Ag, 25% In, and 50% Se. Similarly, for the preparation of $CuIn_yGa_{(1-y)}Se_2$ alloys, the atomic proportions are 25% Cu, n % In, (25-n) % Ga, and 50% Se. In both of these alloy systems, n can range from about 0 to about 25 atomic percent. However, this method can include the addition of slightly more, say about 1.5 to about 3 atomic percent more Se, to make up for Se, which is lost through vaporization during the heating and cooling processes. A quantity of $B_2O_3$ will be intermingled with each reaction mixture. The quantity of $B_2O_3$ will be sufficient, when melted, to form an encapsulating layer of $B_2O_3$ 32, which is at least 2 mm thick, and preferably about 5 mm thick above the reaction mixture. A thinner $B_2O_3$ layer will wet the inside surface of the ampoule 16, so as to surround the reaction mixture.

For alloy formation, after the susceptor 10 containing the reaction mixture and intermingled $B_2O_3$ in the ampoules 16 has been placed on the support 12 within the pressure chamber, the pressure chamber will then be assembled and securely sealed. When the chamber is assembled and sealed as described above, an inert or nonreactive gas, will be pumped into the chamber to a pressure that will substantially equal or exceed the vapor pressure of Se when it is heated. In practice, pressures in the range of from about 50 to about 75 atmospheres will be used. After the chamber has been pressurized in this manner, the rf induction heating coil 24 will be activated to heat the susceptor 10, which will in turn heat the ampoules 16 and their contained reaction mixtures and $B_2O_3$ by conduction.

As the temperature of the system rises, the $B_2O_3$ will begin to soften and melt at approximately 700° C., and the melted $B_2O_3$ will form a liquid encapsulated layer 32 over and around the reaction mixture in each ampoule 16. In the temperature range of about 700° C. to about 750° C., Se will start to vaporize significantly. However, since the $B_2O_3$ is quite soft and substantially melted at those temperatures and covers and encapsulates the reaction mixture, most of the Se vapor will be confined within the $B_2O_3$ layer 32, and thus will remain within ampoules 16. The $B_2O_3$ encapsulate 32, will also wet the inside surface of the ampoules 16.

As heating progresses, the reaction mixtures in the the ampoules will eventually reach a temperature at which they form a melt 34 of $Cu_xAg_{(1-x)}InSe_2$ or $CuIn_yGa_{(1-y)}Se_2$, as the case may be, within the $B_2O_3$ encapsulate 32. In practice, the temperature will usually be raised above the melting point of the reaction mixture, usually to the range of approximately 1025° C. to 1100° C. The melt 34 encapsulated in the $B_2O_3$ layer 32 under the pressure of 55 to 70 atmospheres of gas will be held at elevated temperatures in the range of about 1025° C. to about 1100° C. for approximately two hours, or longer, to allow a complete synthesis and equilibration of the alloy.

As set forth in greater detail in the examples, after synthesis and equilibration of the alloy is completed, the temperature of the system will be decreased by lowering the susceptor 10 from the rf coil 24 at a controlled rate so that the temperature of the melt 34 will drop and begin to form a crystalline structure in the ampoules. A very controlled rate of decrease in temperature will be required through this transition in order to form a good quality, single-crystal structure by the directional solidification or the Bridgman/Stockbarger-type growth method. Otherwise, the phase ordering or structuring of the crystal within this critical phase will not be completed properly, and fissures or cracks will be created in the crystal. Lowering the temperature slowly will bring the alloy through these critical phases with the alloys completely and properly ordered in a large, single-crystal chalcopyrite structure, when such a structure is possible.

Using this method there will be no $B_2O_3$ contamination of the crystalline structure. Furthermore, while quartz is the preferred material for the ampoules 16, and quartz can be slightly reactive with $Cu_xAg_{(1-x)}InSe_2$ or $CuIn_yGa_{(1-y)}Se_2$, there will be no quartz ($SiO_2$) contamination of the crystalline structure. This lack of $SiO_2$ contamination is apparently a result of the $B_2O_3$ encapsulation that completely separates the inside walls of the ampoules 16 from contact with the melt 34.

In the practice of the method of the present invention other refractory ampoule materials, such as vitreous carbon and boron nitride, can be used in place of quartz, using the $B_2O_3$ liquid encapsulation technique to avoid contamination of the alloy melt.

It will be appreciated that the apparatus and cooling method described above may be varied and still produce large, single-grain chalcopyrite alloys of $Cu_xAg_{(1-x)}InSe_2$ and $CuIn_yGa_{(1-y)}Se_2$. For example, once it has been determined to produce a specific alloy a single large crucible, rather than a multiampoule susceptor may be preferred. Similarly, while heating provides great utility, other forms of heating may be used. Also, while a Bridgman/Stockbarger-type of crystal growth method is illustrated, other slow cooling controlled growth methods, such as the Czochralski method, may be used in the practice of the present invention.

EXAMPLES OF THE PREPARATION OF $Cu_xAg_{(1-x)}InSe_2$

Ampoule Preparation

In-situ synthesis from the elemental constituents will be used to prepare melts of $Cu_xAg_{(1-x)}InSe_2$ for crystal growth. For example, each of the six ampoules 16 will be charged with an approximately 16 g mixture of elemental Cu, Ag, In and Se to provide starting compositions corresponding approximately to x=0, 0.25, 0.5, 0.75, 0.9 and 1.0. In subsequent mixtures compositions corresponding to x=0.1, 0.2, 0.3, 0.35, 0.4, 0.45, 0.6, 0.65, 0.7, 0.8, 0.9 and 0.95 will be prepared. In all cases, excess Se (approximately 1.5% to 3% atomic) will be included in the starting composition to compensate for any potential loss of Se in the form of vapor during synthesis. Crushed, high-purity $B_2O_3$ will be interspersed with the elemental constituents in the ampoules. The total amount of $B_2O_3$ will be sufficient to provide an approximately 5-mm-thick encapsulation layer of liquid $B_2O_3$ over and around the elements of the reaction mixture during synthesis and crystal growth. As previously noted the $B_2O_3$ in concert with the approximately 55 to 70 atmospheres of inert gas pressure in the pressure chamber will substantially reduce the loss of volatile Se from the ampoule charge during heating.

Chamber Loading and Heating of the Reaction Mixtures

The susceptor 10 containing the charged ampoules 16 will be placed within the pressure chamber, which will be sealed, purged of air, and filled with inert gas at an initial pressure of about 50 atmospheres. The susceptor, ampoules and reaction mixtures within the pressurized chamber will then be rapidly heated by the rf coil 24 at a rate of about 60° C./min to a temperature in the range of about 1025° C. to about 1100° C., with a mean temperature of about 1060° C. This increase in the temperature will increase the pressure of the inert gas in the vicinity of the open susceptor and ampoules to about 70 atmospheres. Heating will be done with susceptor 10 in the mid-region hot zone of the rf coil 24. The high temperature condition will be maintained for several hours to mix and equilibrate the melt.

Cooling and Crystal Growth

After equilibration of the melt is completed susceptor 10 will initially be lowered 6 cm from the rf coil 24 over a period of about one hour while increasing the rf power, thus reducing the temperature of the melt to about 1005° C. This lowering of the susceptor will provide an initial vertical thermal gradient of about 57° C./cm in the vicinity of the tip of ampoule 16. The susceptor 10 may be lowered further from the rf coil 24, but preferably the rf power will be reduced so that additional cooling will occur until solidification of the melt will take place within this gradient which will provide a temperature decrease at a rate of about 3 to about 3.4° C./h. This will cause the interface to initially advance at about 0.5 to about 0.6 mm/h. Crystal alloy $Cu_xAg_{(1-x)}InSe_2$ growth will be initiated during cooling when the temperature is decreased to a temperature at which solidification begins to occur. Near the end of crystal growth the gradient will be decreased to about 32° C./cm and the interface will advance at about 0.9 to about 1 mm/h.

Thus, for the $Cu_xAg_{(1-x)}InSe_2$ alloy melts produced, cooling at the rate of about 3 to about 3.4° C./h will start when the sample melt is at about 1005° C. When the solidified alloy reaches a temperature of, for example, about 545° C., the cool-down rate will have been increased to about 15° C./h, and at, for example, about 420° C. the cooling rate will be further increased to approximately 40° C./h.

Alloys Produced

When $Cu_xAg_{(1-x)}InSe_2$ crystal growth is completed and the ingots in the ampoules have reached room temperature, the pressure will be bled from the high pressure chamber, the chamber will be opened, the susceptor 10 will be removed from the chamber, and the ampoules 16 will be removed from the susceptor 10 and will be soaked in warm water to dissolve the $B_2O_3$. After soaking, the alloy ingots will easily slide out of the ampoules 16.

One means of characterizing the alloys will be to cut growth wafers from each different alloy ingot, for example, at the 15% solidified position, have one surface of the wafers lapped to a flat 5 μm finish and polished with a dilute bromine/methanol solution on a synthetic pad. The composition of each different alloy wafer measured by electron microprobe at about 20 positions indicated that each of the alloys so produced is substantially uniform in composition throughout its structure.

All of the $Cu_xAg_{(1-x)}InSe_2$ alloys produced had some single crystal chalcopyrite structure. Additionally, many of the $Cu_xAg_{(1-x)}InSe_2$ alloys produced contained some cracks, although the amount of cracking as well as the grain size varied with the alloy composition. Using microscopy, voids of various sizes were observed along some of the cracks.

Single crystal grain sizes of the $Cu_xAg_{(1-x)}InSe_2$ alloys produced ranged from about <0.1 mm to about 14 mm, with the upper grain size apparently being limited primarily by the size of the ampoule. Of more specific interest, in the $Cu_xAg_{(1-x)}InSe_2$ alloys, where x is in the range of about 0.45 to about 0.9, single-crystal grains of greater than about 1 mm will be consistently produced, with at most only slight surface cracking. Furthermore, in the $Cu_xAg_{(1-x)}InSe_2$ alloys where x is in the range of about 0.65 to about 0.8, the alloys were substantially free of cracks and voids and had grain sizes greater than about 5 mm and as great as 14 mm, the limiting size of the ampoule. All of the $Cu_xAg_{(1-x)}InSe_2$ alloys where x is in the range of about 0.45 to about 0.9 had chalcopyrite structure and had indicated utility fo use in photovoltaic power systems and opto-electronic applications. The specific $Cu_xAg_{(1-x)}InSe_2$ alloy, where x is about 0.75, appeared to be of exceptionally large grain size and good surface quality.

P-type conductivity was observed in all of the $Cu_xAg_{(1-x)}InSe_2$ alloy compositions where x is in the range of about 0.45 to about 0.9. For solar cell devices, p-type conductivity is desirable since heterojunctions can then be formed with n-type CdS window layers.

EXAMPLES OF THE PREPARATION OF $CuIn_yGa_{(1-y)}Se_2$

Ampoule Preparation

As with $Cu_xAg_{(1-x)}InSe_2$, in-situ synthesis from the elemental constituents will be used to prepare melts of $CuIn_yGa_{(1-y)}Se_2$ for crystal growth, and each of the six ampoules 16 will be charged with an approximately 16 g mixture of elemental Cu, In, Ga and Se to provide starting compositions corresponding approximately to y=0, 0.25, 0.5, 0.75, 0.9, and 1.0. In subsequent mixtures compositions corresponding to y=0.4, 0.6, 0.7, 0.8, 0.85, 0.9, 0.95, and 0.98 will be prepared. In all cases, excess Se (approximately 1.5% to 3% atomic) will be included in the starting composition to compensate for any potential loss of Se, and crushed, high-purity $B_2O_3$ will be interspersed with the elemental constituents.

Chamber Loading and Heating of the Reaction Mixtures

Loading of the susceptor containing the charged ampoules into the pressure chamber, chamber sealing, air purging, pressurization, and heating was substantially as in the previous example. Again, the high temperature condition will be maintained for several hours to mix and equilibrate the melt.

Cooling and Crystal Growth

Cooling and crystal growth of $CuIn_yGa_{(1-y)}Se_2$ was much like that for the $Cu_xAg_{(1-x)}InSe_2$ example, with the exception that the melts were initially cooled to about 1040° C., rather than to about 1005° C., while the gradient was increased to about 16° C./h at about, for example, 735° C., and, for example, at about 586° C. was increased again to about 40° C./h.

Alloys Produced

The $CuIn_yGa_{(1-y)}Se_2$ ingots were removed from the ampoules, and had growth wafers removed, lapped, and polished as in the previous example. The composition of each different $CuIn_yGa_{(1-y)}Se_2$ alloy wafer measured by electron microprobe at about 40 positions indicated that each alloy is substantially uniform in composition throughout its structure.

All of the $CuIn_yGa_{(1-y)}Se_2$ alloys produced had some single-crystal chalcopyrite structure. Many of the $CuIn_yGa_{(1-y)}Se_2$ alloys produced contained some cracks and some voids were observed along some of the cracks.

Single-crystal grain sizes of the $CuIn_yGa_{(1-y)}Se_2$ alloys ranged from about <0.1 mm to about 14 mm. More specifically, in the $CuIn_yGa_{(1-y)}Se_2$ alloys, where y is in the range of about 0.8 to about 0.98, single-crystal grains of greater than about 1 mm will be consistently produced, with at most only slight surface cracking. Furthermore, in the $CuIn_yGa_{(1-y)}Se_2$ alloys, where y is in the range of about 0.85 to about 0.95 the alloys will be found to be substantially free of cracks and voids and had grain sizes greater than about 5 mm and as great as 14 mm, the limiting size of the ampoule. All of the $CuIn_yGa_{(1-y)}Se_2$ alloys, where y is in the range of about 0.8 to about 0.98, had chalcopyrite structure and had indicated utility for use in photovoltaic power systems and opto-electronic applications. The $CuIn_yGa_{(1-y)}Se_2$ alloys, where y is about 0.9 appeared to be of exceptionally large grain size and good surface quality. P-type conductivity was observed in all of the $CuIn_yGa_{(1-y)}Se_2$ alloy compositions.

The foregoing is considered as illustrative only of the principles of the invention, showing and describing particulars of the invention, with reference to preferred embodiments. Further, since numerous modifications and changes wil readily occur to those skilled in the art, it is not desired to limit the invention to the exact composition and methods detailed and described, and accordingly, all suitable modifications, changes in form and details, and equivalents may be resorted to as falling within the spirit and scope of the invention as defined by the following claims, except as precluded by the prior art.

The embodiments of the invention in which an exclusive property or privilege is claimed are defined as follows:

1. Quaternary IB-IIIA-$Se_2$ alloys of high-quality, single-crystal chalcopyrite structure having large single crystal grains greater than about 5 mm and free of cracks and voids of the size which interfere with good optical absorption coefficients and high band-gap energies, said alloy structure being selected from the group consisting of $Cu_xAg_{(1-x)}InSe_2$ and $CuIn_yGa_{(1-y)}Se_2$, where x is in the range of about 0.65 to 0.8, and where y is in the range of about 0.85 to 0.95.

2. Quaternary IB-IIIA-$Se_2$ alloys of high-quality, single-crystal chalcopyrite structure having large single crystal grains greater than about 5 mm and free of cracks and voids of the size which interfere with good optical absorption coefficients and high band-gap energies, said alloy structure being selected from the group consisting of $Cu_xAg_{(1-x)}InSe_2$ and $CuIn_yGa_{(1-y)}Se_2$, where x is in the range of about 0.65 to 0.8, and where y is in the range of about 0.85 to 0.95, produced by the process comprising the steps of:

placing in a refractory container a reaction mixture of Cu, Ag, In, and Se, or a reaction mixture of Cu, In, Ga, and Se, where such reaction mixture is calculated by atomic percent to produce and desired alloy;

placing $B_2O_3$ in said container in a quantity sufficient for said $B_2O_3$ to completely cover and encapsulate said reaction mixture when said $B_2O_3$ is melted;

placing said container and its said reaction mixture and $B_2O_3$ contents in an enclosed chamber;

creating an environment of pressurized inert or non-reactive gas in said enclosed chamber and over said container and its contents;

while containing said environment of pressurized gas, heating said container and its said contents to a temperature to at least completely melt the said contents of said container, and holding such temperature for a sufficient period of time to equilibrate the melt and synthesize and alloy; and then lowering the temperature of the melt in a controlled manner to solidify it as a quaternary IB-IIIA-$Se_2$ alloy of high-quality, single-crystal chalcopyrite structure.

* * * * *